US011581195B2

(12) United States Patent
Xue et al.

(10) Patent No.: US 11,581,195 B2
(45) Date of Patent: Feb. 14, 2023

(54) SEMICONDUCTOR PACKAGE HAVING WETTABLE LEAD FLANK AND METHOD OF MAKING THE SAME

(71) Applicant: ALPHA AND OMEGA SEMICONDUCTOR INTERNATIONAL LP, Sunnyvale, CA (US)

(72) Inventors: Yan Xun Xue, Los Gatos, CA (US); Long-Ching Wang, Cupertino, CA (US); Lei Fukuda, Pleasanton, CA (US); Adrian Chee Heong Koh, San Jose, CA (US); Peter Wilson, Lathrop, CA (US); Feng Ye, Shanghai (CN)

(73) Assignee: ALPHA AND OMEGA SEMICONDUCTOR INTERNATIONAL LP, Toronto (CA)

( * ) Notice: Subject to any disclaimer, the term of this patent is extended or adjusted under 35 U.S.C. 154(b) by 0 days.

(21) Appl. No.: 17/129,319

(22) Filed: Dec. 21, 2020

(65) Prior Publication Data

US 2022/0199425 A1    Jun. 23, 2022

(51) Int. Cl.
*H01L 21/48* (2006.01)
*H01L 21/56* (2006.01)
*H01L 23/00* (2006.01)
*H01L 23/495* (2006.01)

(52) U.S. Cl.
CPC ........ *H01L 21/4842* (2013.01); *H01L 21/561* (2013.01); *H01L 23/49562* (2013.01); *H01L 23/49565* (2013.01); *H01L 23/49582* (2013.01); *H01L 24/40* (2013.01); *H01L 24/48* (2013.01); *H01L 24/84* (2013.01); *H01L 24/85* (2013.01); *H01L 2224/40245* (2013.01); *H01L 2224/48245* (2013.01)

(58) Field of Classification Search
CPC .................................................... H01L 21/4842
USPC ........................................................ 257/676
See application file for complete search history.

(56) References Cited

U.S. PATENT DOCUMENTS

| 8,008,758 | B1* | 8/2011 | Kim ................. | H01L 23/49541 |
| | | | | 257/E23.047 |
| 2014/0312480 | A1* | 10/2014 | Gong ................ | H01L 23/49537 |
| | | | | 257/675 |
| 2017/0271246 | A1* | 9/2017 | Macheiner ............ | H01L 24/73 |
| 2018/0226327 | A1* | 8/2018 | Fukuzaki ............ | H01L 21/4842 |

* cited by examiner

*Primary Examiner* — Ajay Arora
(74) *Attorney, Agent, or Firm* — Chen-Chi Lin

(57) ABSTRACT

A semiconductor package comprises a lead frame, a chip, and a molding encapsulation. The lead frame comprises one or more die paddles, a first plurality of leads, and a second plurality of leads. A respective end surface of each lead of the first plurality of leads and the second plurality of leads is plated with a metal. A first respective window on a first side of each lead of the first plurality of leads and the second plurality of leads is not plated with the metal. A second respective window on a second side of each lead of the first plurality of leads and the second plurality of leads is not plated with the metal. A method for fabricating a semiconductor package comprises the steps of providing a lead frame array, mounting a chip, forming a molding encapsulation, and applying a cutting process or a punching process.

15 Claims, 11 Drawing Sheets

SEMICONDUCTOR PACKAGE HAVING WETTABLE LEAD FLANK AND METHOD OF MAKING THE SAME

FIELD OF THE INVENTION

This invention relates generally to a semiconductor package having a plurality of leads with wettable flanks and a method of making the same. More particularly, the present invention relates to a semiconductor package fabricated using a lead frame comprising dam bars and slots.

BACKGROUND OF THE INVENTION

Conventional Quad-flat no leads (QFN) and Dual-flat no leads (DFN) micro lead packages comprise exposed copper at end surfaces of leads after a singulation process or a punching process. The exposed copper subjects to oxidation over time. The oxidized copper end surfaces degrades a solder connection quality after a reflow process to integrate the QFN packages and the DFN packages with a printed circuit board (PCB). It requires an automatic X-ray inspection (AXI) to check the quality of the solder connection. The AXI is expensive and complicated.

The present disclosure provides a solution by introducing wettable, metal plated end surfaces of the leads of a semiconductor package including QFN packages and DFN packages. It only requires an automatic optical inspection (AOI) to check the quality of the solder connection. AOI is much cheaper than AXI. The present disclosure also improves the board level reliability (BLR).

SUMMARY OF THE INVENTION

The present invention discloses a semiconductor package comprising a lead frame, a chip, and a molding encapsulation. The lead frame comprises one or more die paddles, a first plurality of leads, and a second plurality of leads. A respective end surface of each lead of the first plurality of leads and the second plurality of leads is plated with a metal. A first respective window on a first side of each lead of the first plurality of leads and the second plurality of leads is not plated with the metal. A second respective window on a second side of each lead of the first plurality of leads and the second plurality of leads is not plated with the metal.

A method for fabricating a semiconductor package is also disclosed. The method comprises the steps of providing a lead frame array, mounting a chip, forming a molding encapsulation, and applying a cutting process or a punching process.

DETAILED DESCRIPTION OF THE INVENTION

Figure 1:
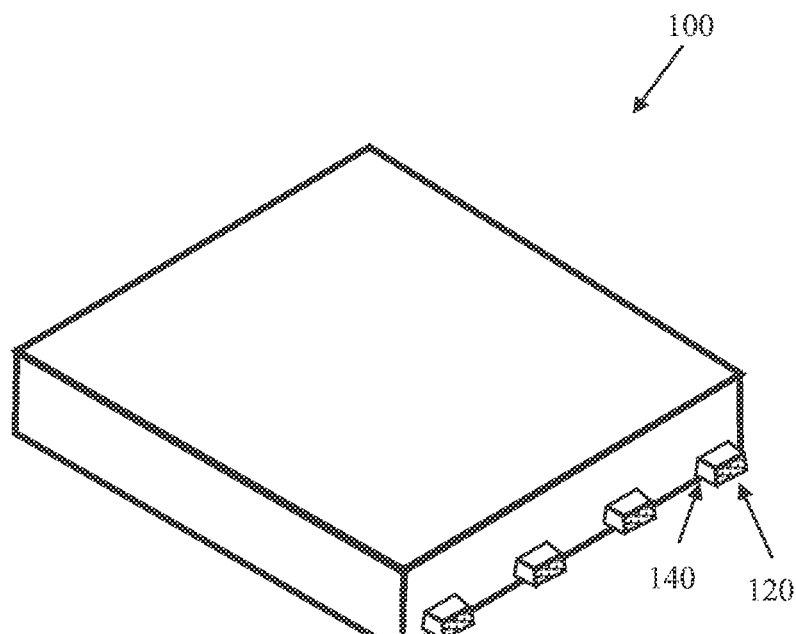
FIG. 1 shows a perspective view of a conventional semiconductor package.

FIG. 1 shows a perspective view of a conventional semiconductor package 100. The conventional semiconductor package 100 comprises a plurality of leads 110. An entirety of a respective side surface 140 of each of the plurality of leads 110 is covered by a plated metal material to improve solderability. An entirety of a respective end surface 120 of each of the plurality of leads 110 is not covered be the plated metal material. Copper is exposed from the respective end surface 120. Oxidation, over time, of copper exposed from the respective end surface 120 results in non-wettable flank, thus causing connection issues in a solder reflow process while integrating the conventional semiconductor package 100 with a printed circuit board (PCB).

Figure 2:
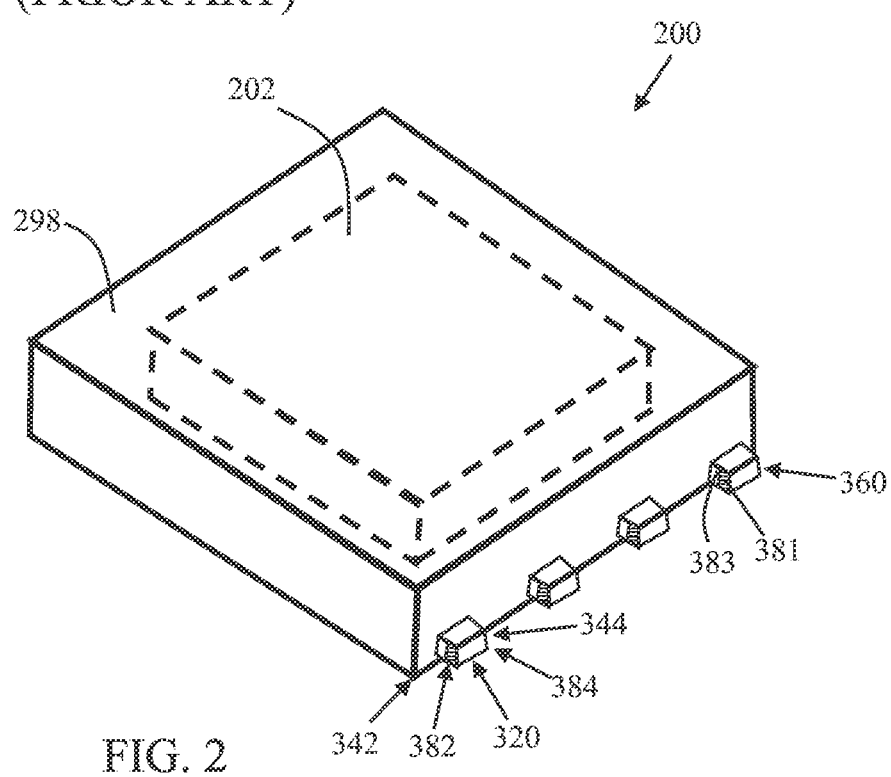
FIG. 2 shows a perspective view of a semiconductor package in examples of the present disclosure.
Figure 3:
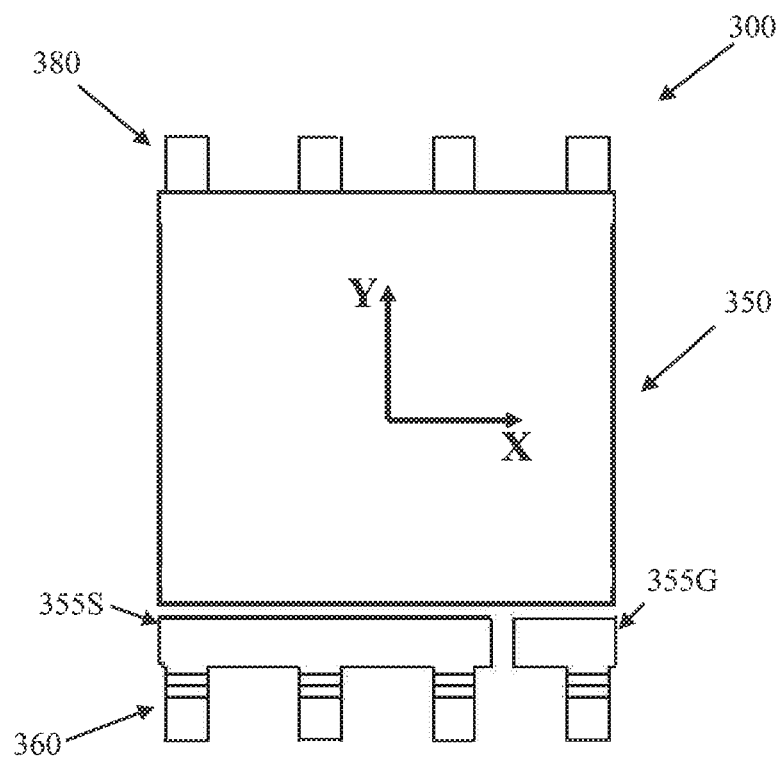
FIG. 3 shows a top view of a lead frame in examples of the present disclosure.

FIG. 2 shows a perspective view of a semiconductor package 200 in examples of the present disclosure. FIG. 3 shows a top view of a lead frame 300 in examples of the present disclosure. The semiconductor package 200 comprises a lead frame 300 of FIG. 3, a chip 202, and a molding encapsulation 298. The molding encapsulation 298 encloses the chip 202 (shown in dashed lines). A portion of a top surface of the lead frame 300 is covered by the molding encapsulation 298. In examples of the present disclosure, an entirety of the top surface of the lead frame 300 is a flat plane.

Still referring to FIGS. 2 and 3, the lead frame 300 comprises one or more die paddles 350, a first plurality of leads 360, and a second plurality of leads 380. In examples of the present disclosure, the one or more die paddles 350 are of rectangular shapes. Though only one die paddle 350 is shown in FIG. 3, the number of die paddles may vary. The first plurality of leads 360 extend away from the one or more die paddles 350 along a first direction. The second plurality of leads 380 extend away from the one or more die paddles 350 along a second direction opposite the first direction. In examples of the present disclosure, the first plurality of leads 360 may connect to one or more bonding areas 355S and 355G disposed alongside the one or more die paddles 350 and the second plurality of leads 380 may connect to the one or more die paddles 350. Alternatively, the second plurality of leads 380 may fused together without separation (not shown). The chip 202 is attached to the one or more die paddles 350 of the lead frame 300. In one example, the chip 202 is a power semiconductor device such as a MOSFET with a source electrode and a gate electrode on a top surface and a drain electrode on a bottom surface. In another example, the chip 202 is an IC chip with a plurality of electrodes on a top surface.

A respective end surface 320 of each lead of the first plurality of leads 360 and the second plurality of leads 380 is plated with a metal to improve solderability. In one example, the metal is tin, Sn. The respective end surface 320 is wettable. A first respective window 382 on a first side 342 of each lead of the first plurality of leads 360 and the second plurality of leads 380 extending outside the molding encapsulation 298 is not plated with the metal. A second respective window 384 on a second side 344 of each lead of the first plurality of leads 360 and the second plurality of leads 380 extending outside the molding encapsulation 298 is not plated with the metal. The first side 342 of each lead is opposite the second side 344 of each lead. The first respective windows 382 and second respective windows 384 on the first plurality of leads 360 are substantially align to each other, while the first respective windows 382 and second respective windows 384 on the second plurality of leads 380 are substantially align to each other. In examples of the present disclosure, copper is exposed from the first respective window 382 and the second respective window 384. Oxidation, over time, of copper exposed from the first respective window 382 and the second respective window 384 results in non-wettable flank, thus preventing electrical short because solder will not be built up to connect a side of a lead to a side of an adjacent lead during a reflow process while integrating the semiconductor package 200 with a PCB.

The first respective window 382 is closer to the respective end surface 320 of each lead of the first plurality of leads 360 and the second plurality of leads 380 than the molding encapsulation 298. The second respective window 384 is closer to the respective end surface 320 of each lead of the first plurality of leads 360 and the second plurality of leads 380 than the molding encapsulation 298.

In examples of the present disclosure, the first respective window 382 is of a rectangular shape. The second respective window 384 is of the rectangular shape. In one example, a height of the rectangular shape is the same as a height of each lead of the first plurality of leads 360 and the second plurality of leads 380. In another example, a height of the rectangular shape is in a range from 70% to 90% of a height of each lead of the first plurality of leads 360 and the second plurality of leads 380. In one example, a side of the rectangular shape is aligned with a side of each lead of the first plurality of leads and the second plurality of leads. In another example, the rectangular shape comprises a first side 381 close to the end surface 320 and a second side 383 away from the end surface 320. A distance 901 of FIG. 9 between the first side 381 (or 981 of FIG. 9) and the end surface 320 (or 920 of FIG. 9) is in a range from 2% to 20% of a distance 903 of FIG. 9 between the first side 381 (or 981 of FIG. 9) and the molding encapsulation 298 (or molding encapsulation 898 of FIG. 8).

Figure 4:
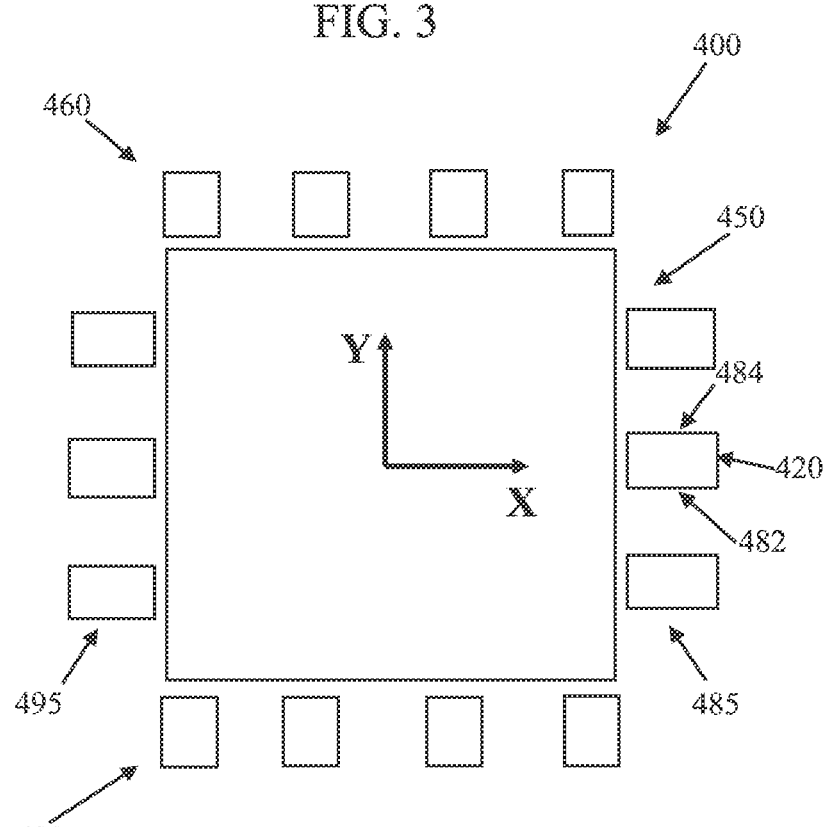
FIG. 4 shows a top view of another lead frame in examples of the present disclosure.

FIG. 4 shows a top view of a lead frame 400 in examples of the present disclosure. In examples of the present disclosure, an entirety of the top surface of the lead frame 400 is a flat plane.

The lead frame 400 comprises one or more die paddles 450, a first plurality of leads 460 disposed on a first side of the one or more die paddles 450, a second plurality of leads 480 disposed on a second side of the one or more die paddles 450, a third plurality of leads 485 disposed on a third side of the one or more die paddles 450, a fourth plurality of leads 495 disposed on a fourth side of the one or more die paddles 450. In examples of the present disclosure, the one or more die paddles 450 are of rectangular shapes. The first plurality of leads 460 extend away from the one or more die paddles 450 along a first direction (positive Y-direction). The second plurality of leads 480 extend away from the one or more die paddles 450 along a second direction (negative Y-direction) opposite the first direction (negative Y-direction is opposite positive Y-direction). A third plurality of leads 485 extend away from the one or more die paddles 450 along a third direction (positive X-direction) perpendicular to the first direction (X-direction is perpendicular to Y-direction). A fourth plurality of leads 495 extend away from the one or more die paddles 450 along a fourth direction (negative X-direction) opposite the third direction (negative X-direction is opposite positive X-direction). In examples of the present disclosure, the first plurality of leads 460, the second plurality of leads 480, the third plurality of leads 485, and the fourth plurality of leads 495 are symmetric with respect to the X-axis. The first plurality of leads 460, the second plurality of leads 480, the third plurality of leads 485, and the fourth plurality of leads 495 are symmetric with respect to the Y-axis.

A respective end surface 420 of each lead of the first plurality of leads 460, the second plurality of leads 480, the third plurality of leads 485 and the fourth plurality of leads 495 is plated with a metal. A first respective window 482 on a first side of each lead of the first plurality of leads 460, the second plurality of leads 480, the third plurality of leads 485 and the fourth plurality of leads 495 is not plated with the metal. A second respective window 484 on a second side of each lead of the first plurality of leads 460, the second plurality of leads 480, the third plurality of leads 485 and the fourth plurality of leads 495 is not plated with the metal.

Figure 5:
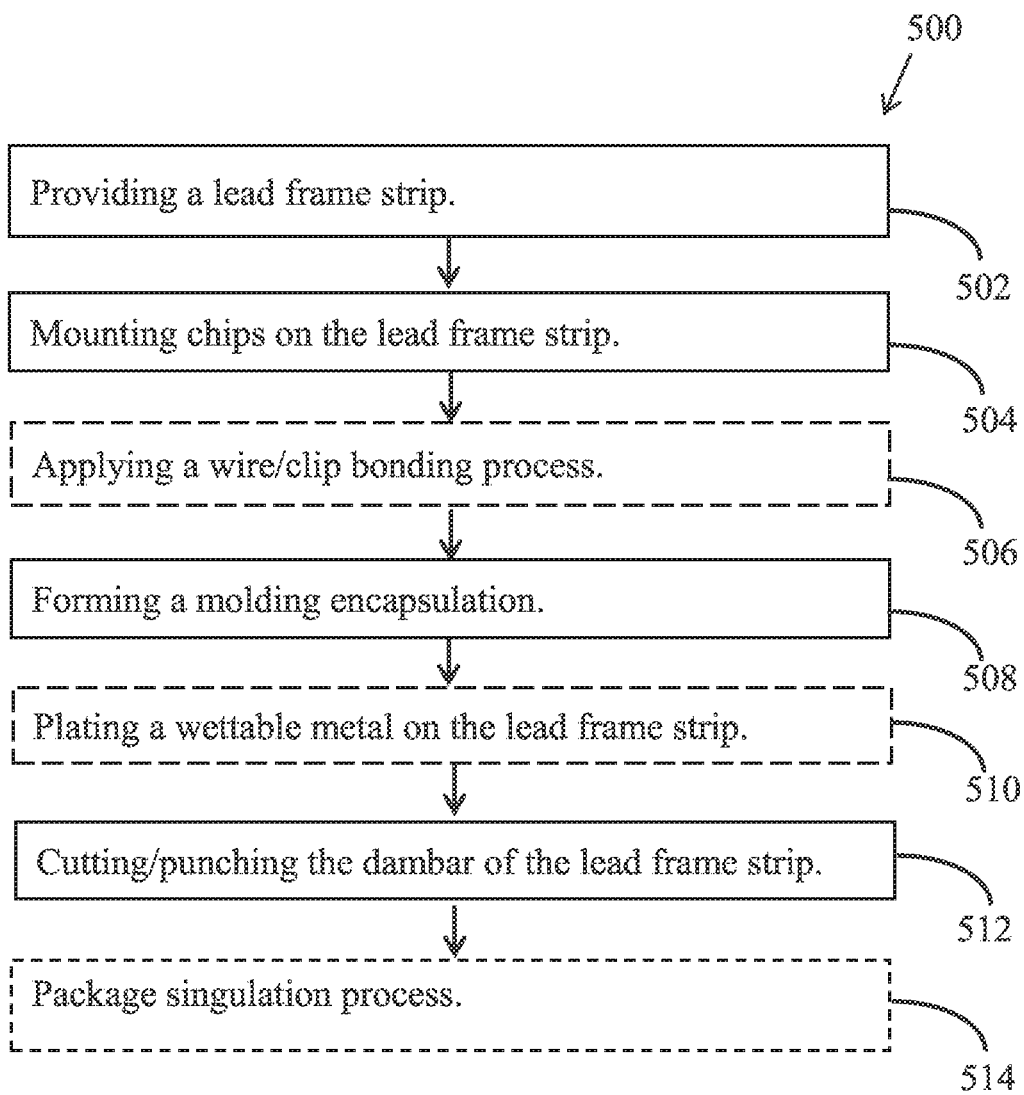
FIG. 5 is a flowchart of a process to develop a semiconductor package in examples of the present disclosure.

FIG. 5 is a flowchart of a process 500 to develop a semiconductor package in examples of the present disclosure. The process 500 may start from block 502. FIGS. 6 and 7A-7E show the top view of the corresponding steps. For simplicity, if a lead frame array contains two or more lead frames, only one lead frame is shown in FIGS. 7A-7E.

Figure 6:
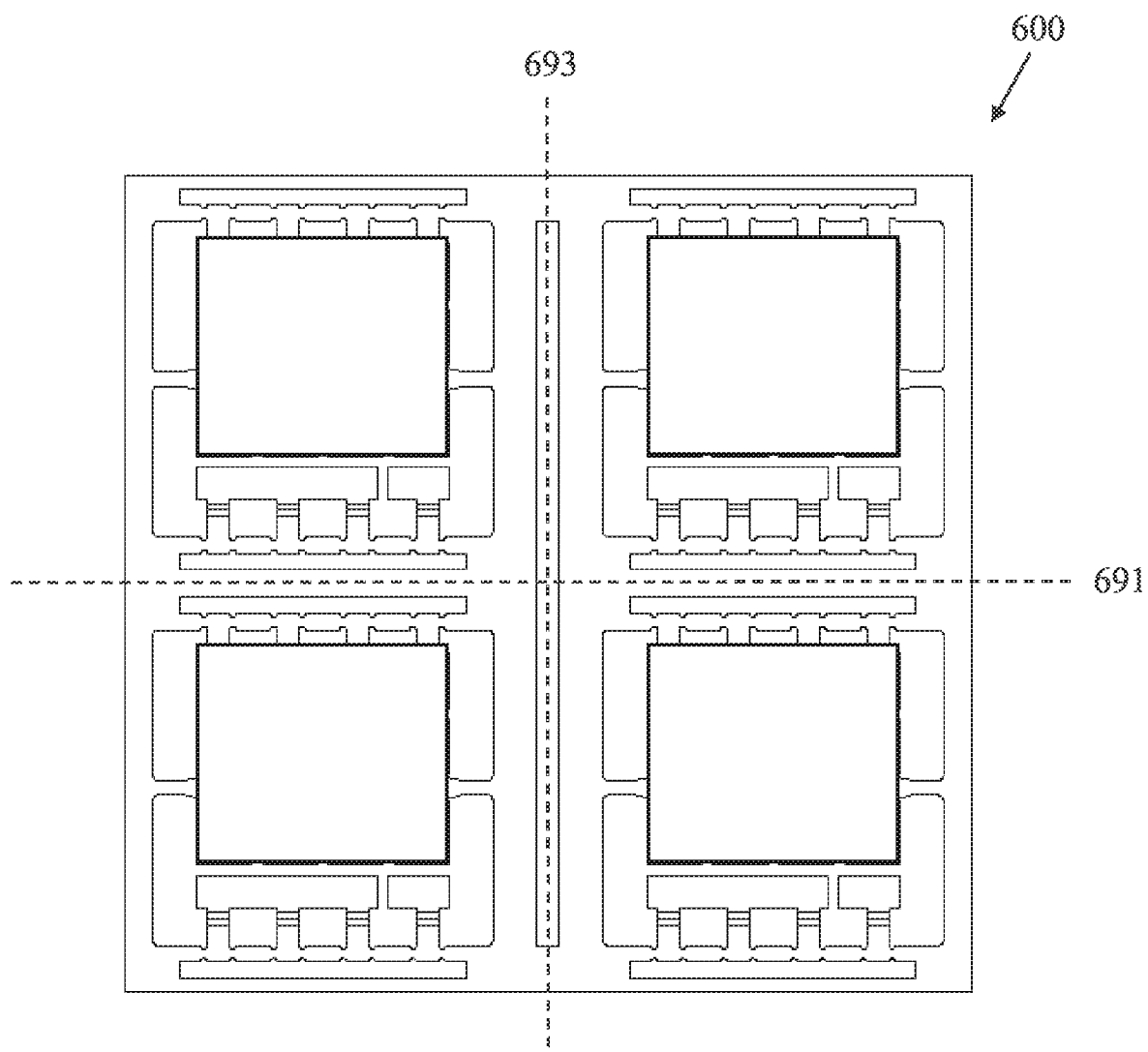
FIG. 6 shows a top view of a lead frame array in examples of the present disclosure.

In block 502, referring now to FIGS. 6 and 7, a lead frame array 600 is provided. The lead frame array 600 comprises one or more lead frames 700. Each lead frame 700 comprises one or more die paddles 750, a first dam bar 710, a second dam bar 720, a first slot 719, a second slot 729, a first plurality of leads 760, and a second plurality of leads 780. The first dam bar 710 comprises a first plurality of dam bar connecting sections 712. The second dam bar 720 comprises a second plurality of dam bar connecting sections 722. The first slot 719 is between the first dam bar 710 and a first side 701 of the lead frame 700. The second slot 729 is between the second dam bar 720 and a second side 702 of the lead frame 700.

The first plurality of leads 760 extend away from the one or more die paddles 750 along a first direction (negative Y-direction). Each of the first plurality of leads 760 is connected to the first dam bar 710. A second plurality of leads 780 extend away from the one or more die paddles 750 along a second direction (positive Y-direction). Each of the second plurality of leads 780 is connected to the second dam bar 720.

In examples of the present disclosure, each of the first plurality of dam bar connecting sections 712 comprises a first end section 712A, a center section 712B, and a second end section 712C. The center section 712B is between the first end section 712A and the second end section 712C. A cross-sectional area of the first end section 712A is smaller than a cross-sectional area of the center section 712B. A cross-sectional area of the second end section 712C is smaller than the cross-sectional area of the center section 712B.

In examples of the present disclosure, each of the second plurality of dam bar connecting sections 722 comprises a first end section 722A, a center section 722B, and a second end section 722C. The center section 722B is between the first end section 722A and the second end section 722C. A cross-sectional area of the first end section 722A is smaller than a cross-sectional area of the center section 722B. A cross-sectional area of the second end section 722C is smaller than the cross-sectional area of the center section 722B.

In examples of the present disclosure, the lead frame array 600 is a pre-plated frame (PPF) array. Block 502 may be followed by block 504. In examples shown in FIGS. 6 and 7, configuration of the one or more die paddles and pluralities of leads is the same as that shown in FIG. 3. Alternatively, the second plurality of leads 780 may be fused together without separation.

Figure 7A:
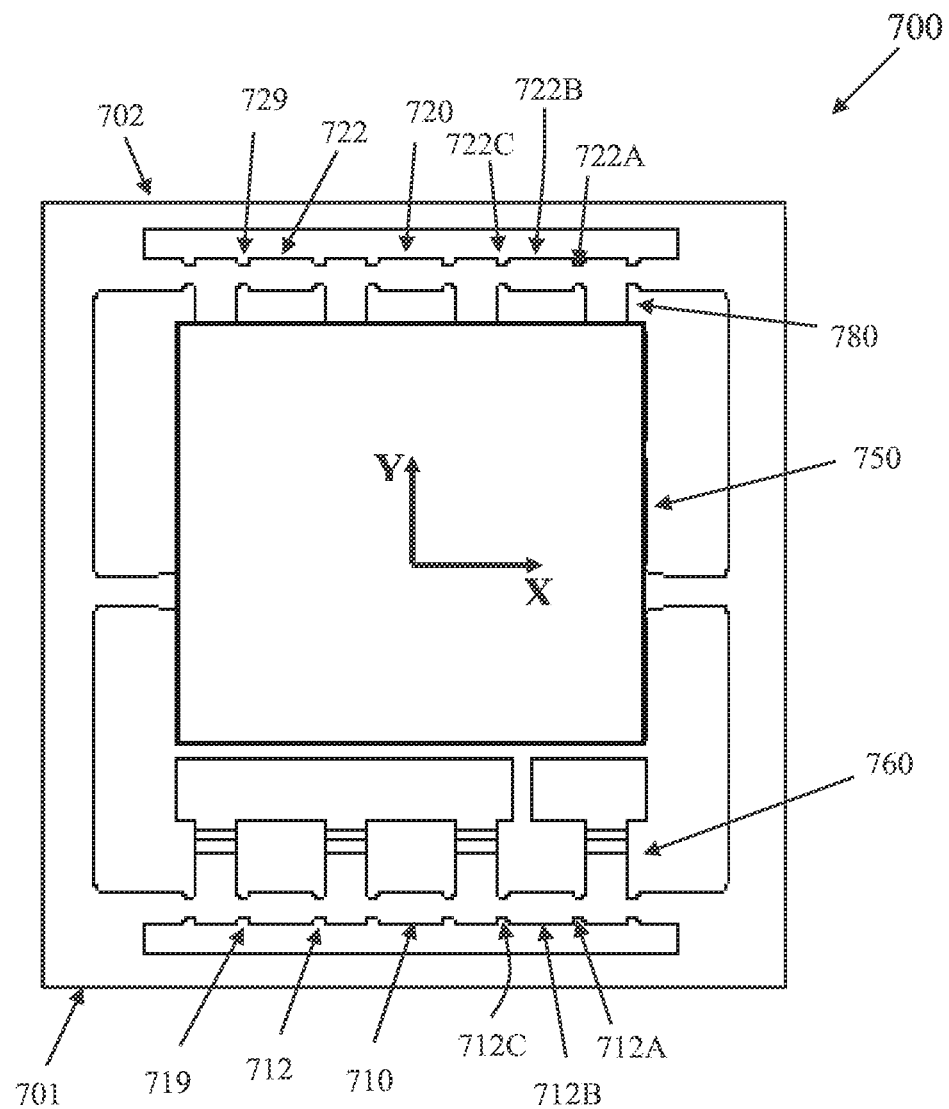
FIGS. 7A, 7B, 7C, 7D, and 7E show the steps of the process to fabricate a semiconductor package in examples of the present disclosure.
Figure 7B:
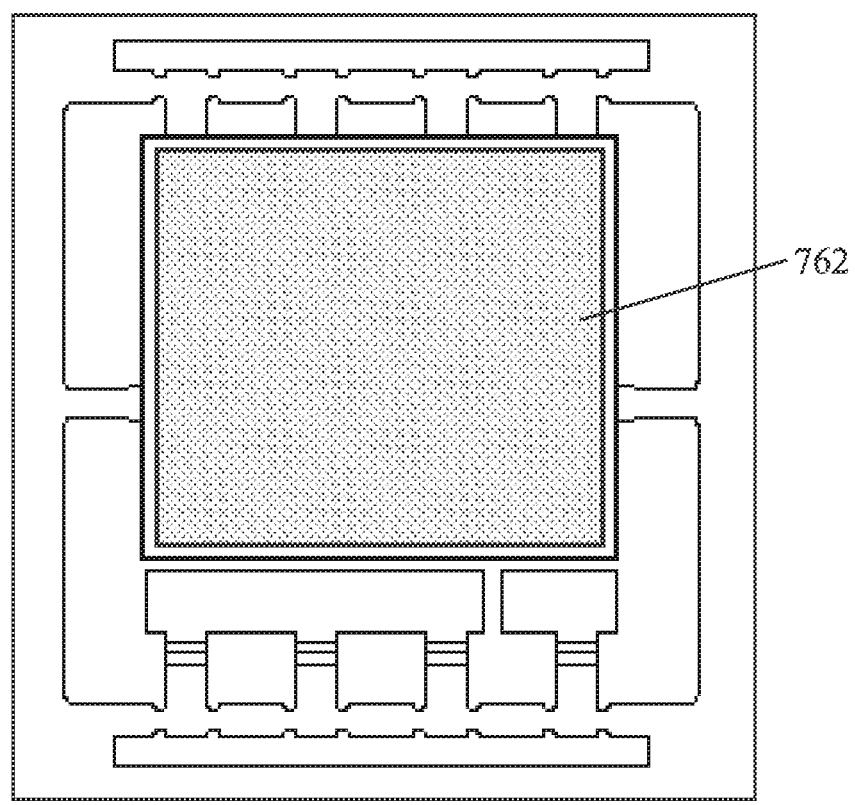

In block 504, referring now to FIG. 7B, a chip 762 is mounted on the one or more die paddles 750. Block 504 may be followed by block 506 or block 508.

Figure 7C:
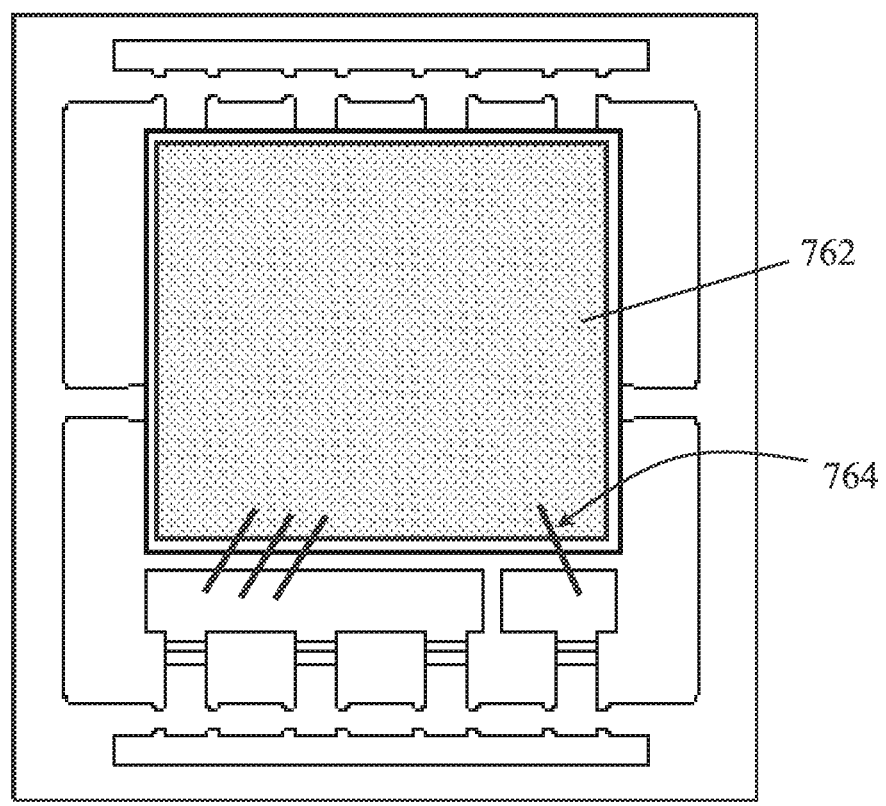

In optional block 506 (shown in dashed lines), referring now to FIG. 7C, a wire bonding process is applied. One or more wires 764 connect the chip 762 to the first plurality of leads 760 and the second plurality of leads 780. In the example shown, the chip 762 comprises a power semiconductor transistor, such as MOSFET, with a bottom drain electrode disposed on a bottom surface of the chip and a top source electrode and a top gate electrode disposed on a top surface of the chip. One or more wires 764 connect the top source electrode to one or more source lead in the first plurality of leads 760, and one wire 764 connects the top gate electrode to a gate lead in the first plurality of leads 760. The bottom drain electrode connects to the second plurality of leads through the one or more die paddle 750. In one example, wire bonding process is replaced by a clip bonding process. One or more wires 764 are replaced by one or more metal clips. Block 506 may be followed by block 508.

Figure 7D:
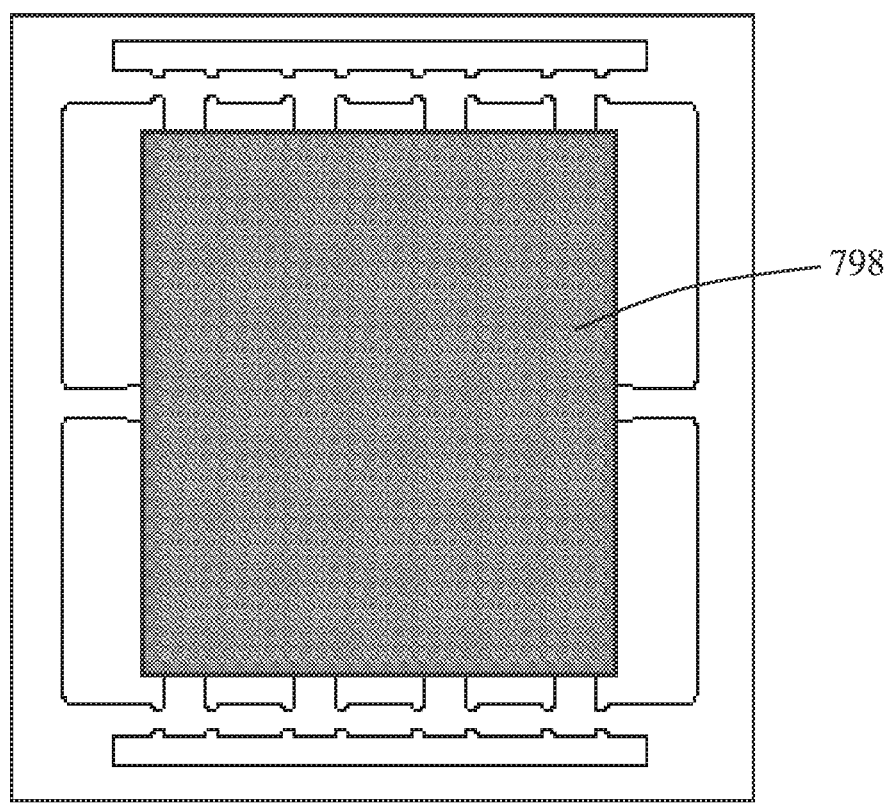

In block 508, referring now to FIG. 7D, a molding encapsulation 798 is formed. The molding encapsulation 798 encloses the chip 762. Block 508 may be followed by block 510 or block 512.

Figure 7E:
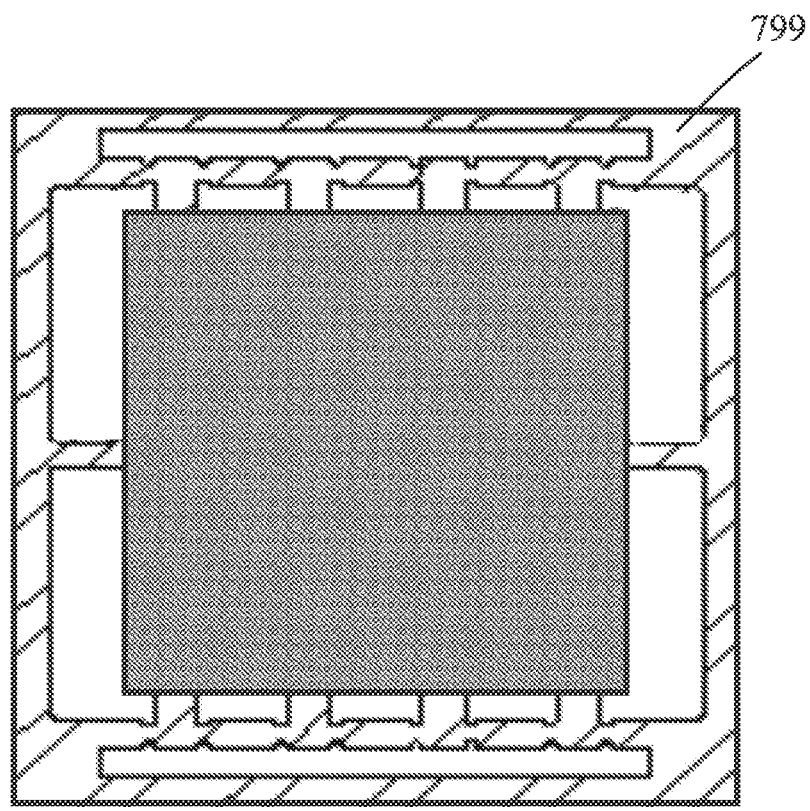

In optional block 510 (shown in dashed lines), referring now to FIG. 7E, portions of the lead frame 700, not covered by the molding encapsulation 798, are plated with a metal 799. In one example, the metal 799 is a wettable metal. In examples of the present disclosure, the plated metal is tin, Sn. Block 510 may be followed by block 512.

In block 512, referring now to FIG. 2, a cutting process or a punching process is applied so as to form a plurality of semiconductor packages. The first plurality of dam bar connecting sections 712 and the second plurality of dam bar connecting sections 722 are removed. A respective end surface 320 of each lead of the first plurality of leads and the second plurality of leads is plated with a metal because of the lead frame array 600 being PPF array of block 502 or because of the plating process of block 510. A first respective window 382 on a first side of each lead of the first plurality of leads and the second plurality of leads is not plated with the metal because of removing of the first plurality of dam bar connecting sections 712. A second respective window 384 on a second side of each lead of the first plurality of leads and the second plurality of leads is not plated with the metal because of removing of the second plurality of dam bar connecting sections 722. Block 512 may be followed by optional block 514.

In optional block 514 (shown in dashed lines), referring now to FIG. 6, a singulation process is applied if the lead frame array comprises two or more lead frames 700. Cuttings along lines 691 and 693 are conducted so as to form a plurality of separated semiconductor packages.

Figure 8:
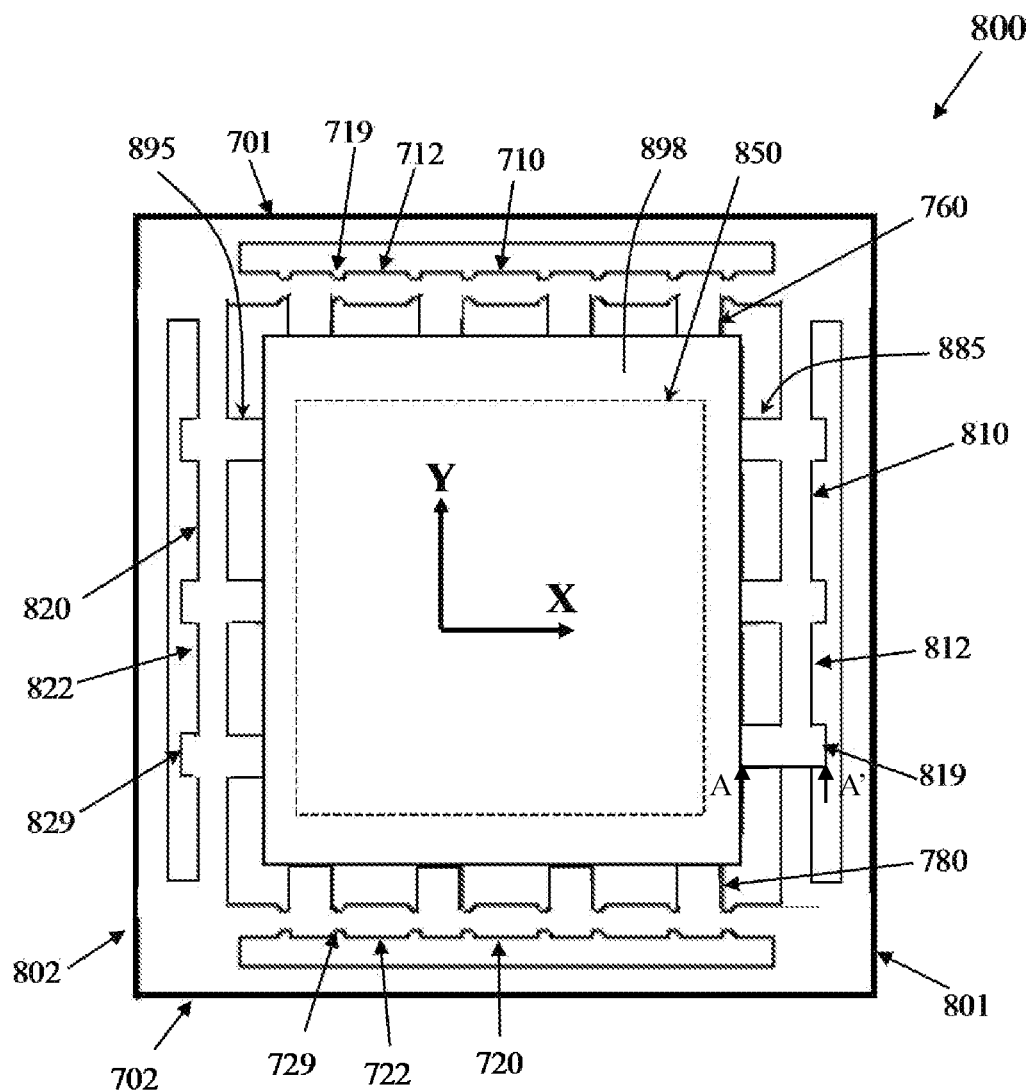
FIG. 8 shows a top view of still another lead frame in examples of the present disclosure.
Figure 9:
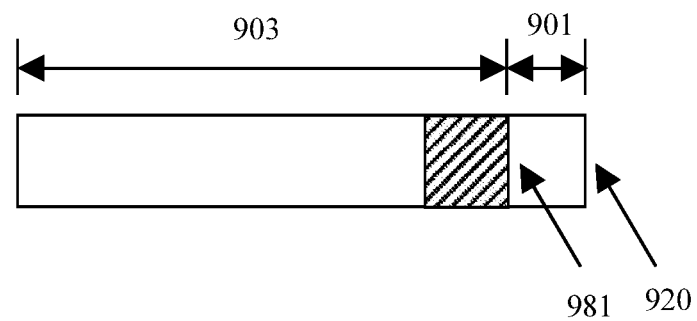
FIG. 9 is a cross-sectional plot of a portion of the lead frame of FIG. 8 being viewed along the arrows of AA' of FIG. 8 in examples of the present disclosure.

Process 500 may be also applied to the lead frame 800 of FIG. 8 for packaging an IC chip with multiple electrodes disposed on the top surface of the chip. The lead frame 800 comprises one or more die paddles 850 (dash line), a first dam bar 710, a second dam bar 720, a third dam bar 810, a fourth dam bar 820, a first slot 719, a second slot 729, a third slot 819, a fourth slot 829, a first plurality of leads 760, a second plurality of leads 780, a third plurality of leads 885, and a fourth plurality of leads 895. The first dam bar 710 comprises a first plurality of dam bar connecting sections 712. The second dam bar 720 comprises a second plurality of dam bar connecting sections 722. The third dam bar 810 comprises a third plurality of dam bar connecting sections 812. The fourth dam bar 820 comprises a fourth plurality of dam bar connecting sections 822. The first slot 719 is between the first dam bar 710 and a first side 701 of the lead frame 800. The second slot 729 is between the second dam bar 720 and a second side 702 of the lead frame 800. The third slot 819 is between the third dam bar 810 and a third side 801 of the lead frame 800. The fourth slot 829 is between the fourth dam bar 820 and a fourth side 802 of the lead frame 800.

Still referring to FIG. 8, the first plurality of leads 760 extend away from the one or more die paddles 850 along a first direction (positive Y-direction) outside the molding encapsulation 898. Each of the first plurality of leads 760 is connected to the first dam bar 710. A second plurality of leads 780 extend away from the one or more die paddles 850 along a second direction (negative Y-direction) outside the molding encapsulation 898. Each of the second plurality of leads 780 is connected to the second dam bar 720. The third plurality of leads 885 extend away from the one or more die paddles 850 along a third direction (positive X-direction) outside the molding encapsulation 898. Each of the third plurality of leads 885 is connected to the third dam bar 810. A fourth plurality of leads 895 extend away from the one or more die paddles 850 along a fourth direction (negative X-direction) outside the molding encapsulation 898. Each of the fourth plurality of leads 895 is connected to the fourth dam bar 820.

Referring now to FIGS. 4 and 8, the cutting process or the punching process of block 512 removes the first plurality of dam bar connecting sections 712, the second plurality of dam bar connecting sections 722, the third plurality of dam bar connecting sections 812, and the fourth plurality of dam bar connecting sections 822, thus a semiconductor package on the lead frame 400 of FIG. 4 is formed.

Those of ordinary skill in the art may recognize that modifications of the embodiments disclosed herein are possible. For example, a number of leads may vary. Other modifications may occur to those of ordinary skill in this art, and all such modifications are deemed to fall within the purview of the present invention, as defined by the claims.

The invention claimed is:
1. A method for fabricating a semiconductor package, the method comprising the steps of:
   providing a lead frame array comprising
      one or more lead frames, each lead frame of the one or more lead frames comprising one or more die paddles;
      a first dam bar comprising
         a first plurality of dam bar connecting sections;
      a second dam bar comprising
         a second plurality of dam bar connecting sections;
      a first slot between the first dam bar and a first side of said each lead frame;
      a second slot between the second dam bar and a second side of said each lead frame, the second side of said each lead frame being opposite the first side of said each lead frame;

a first plurality of leads extending away from the one or more die paddles along a first direction, each of the first plurality of leads being connected to the first dam bar; and a second plurality of leads extending away from the one or more die paddles along a second direction opposite the first direction, each of the second plurality of leads being connected to the second dam bar;

mounting a chip on the one or more die paddles;

forming a molding encapsulation enclosing the chip; and applying a cutting process or a punching process removing the first plurality of dam bar connecting sections and the second plurality of dam bar connecting sections;

wherein a respective end surface of each lead of the first plurality of leads and the second plurality of leads is plated with a metal;

wherein a first respective window on a first side of each lead of the first plurality of leads and the second plurality of leads is not plated with the metal;

wherein a second respective window on a second side of each lead of the first plurality of leads and the second plurality of leads is not plated with the metal;

wherein the first respective window on the first side of each lead of the first plurality of leads and the second plurality of leads is of a rectangular shape;

wherein the second respective window on the second side of each lead of the first plurality of leads and the second plurality of leads is of the rectangular shape;

wherein the rectangular shape comprises
a first side and
a second side opposite the first side;

wherein the first side of the rectangular shape is closer to the end surface of each lead of the first plurality of leads and the second plurality of leads than the second side of the rectangular shape; and wherein a distance between the first side of the rectangular shape and the end surface is in a range from two percent to twenty percent of a distance between the first side of the rectangular shape and the molding encapsulation.

2. The method of claim 1, before the step of forming the molding encapsulation, applying a wire bonding process or a clip bonding process.

3. The method of claim 1, wherein the lead frame array is a pre-plated frame (PPF) array.

4. The method of claim 1, after the step of forming the molding encapsulation, plating tin on portions of the lead frame array not covered by the molding encapsulation.

5. The method of claim 1, after the step of applying the cutting process or the punching process, applying a singulation process.

6. The method of claim 1, wherein each of the first plurality of dam bar connecting sections and the second plurality of dam bar connecting sections comprises
a first end section;
a center section; and
a second end section opposite the first end section;
wherein a cross-sectional area of the first end section is smaller than a cross-sectional area of the center section; and
wherein a cross-sectional area of the second end section is smaller than the cross-sectional area of the center section.

7. The method of claim 1, wherein each lead frame of the one or more lead frames comprises a third dam bar comprising
a third plurality of dam bar connecting sections;
a fourth dam bar comprising
a fourth plurality of dam bar connecting sections;
a third slot between the third dam bar and a third side of said each lead frame;
a fourth slot between the fourth dam bar and a fourth side of said each lead frame, the fourth side of said each lead frame being opposite the third side of said each lead frame;
a third plurality of leads extending away from the one or more die paddles along a third direction perpendicular to the first direction, each of the third plurality of leads being connected to the third dam bar; and
a fourth plurality of leads extending away from the one or more die paddles along a fourth direction opposite the third direction, each of the fourth plurality of leads being connected to the fourth dam bar;
wherein said applying the cutting process or the punching process removes the third plurality of dam bar connecting sections and the fourth plurality of dam bar connecting sections.

8. A semiconductor package comprising:
a lead frame comprising
one or more die paddles;
a first plurality of leads extending away from the one or more die paddles along a first direction; and
a second plurality of leads extending away from the one or more die paddles along a second direction opposite the first direction;
a chip attached to the one or more die paddles of the lead frame; and
a molding encapsulation enclosing the chip;
wherein a respective end surface of each lead of the first plurality of leads is plated with a metal;
wherein a first respective window on a first side of each lead of the first plurality of leads is not plated with the metal;
wherein a second respective window on a second side of each lead of the first plurality of leads is not plated with the metal;
wherein the first side of each lead is opposite the second side of each lead;
wherein the first respective window on the first side of each lead of the first plurality of leads and the second plurality of leads is of a rectangular shape;
wherein the second respective window on the second side of each lead of the first plurality of leads and the second plurality of leads is of the rectangular shape;
wherein the rectangular shape comprises
a first side; and
a second side opposite the first side;
wherein the first side of the rectangular shape is closer to the end surface of each lead of the first plurality of leads and the second plurality of leads than the second side of the rectangular shape; and
wherein a distance between the first side of the rectangular shape and the end surface is in a range from two percent to twenty percent of a distance between the first side of the rectangular shape and the molding encapsulation.

9. The semiconductor package of claim 8, wherein a respective end surface of each lead of the second plurality of leads is plated with the metal; wherein a first respective window on a first side of each lead of the second plurality of leads is not plated with the metal; wherein a second respective window on a second side of each lead of the second plurality of leads is not plated with the metal.

10. The semiconductor package of claim 9, wherein the first respective window on the first side of each lead of the first plurality of leads and the second plurality of leads is closer to the respective end surface of each lead of the first plurality of leads and the second plurality of leads than the molding encapsulation; and wherein the second respective window on the second side of each lead of the first plurality of leads and the second plurality of leads is closer to the respective end surface of each lead of the first plurality of leads and the second plurality of leads than the molding encapsulation.

11. The semiconductor package of claim 8, wherein a height of the rectangular shape is the same as a height of each lead of the first plurality of leads and the second plurality of leads.

12. The semiconductor package of claim 8, wherein a height of the rectangular shape is in a range from seventy percent to ninety percent of a height of each lead of the first plurality of leads and the second plurality of leads.

13. The semiconductor package of claim 8, wherein a respective end surface of each lead of the second plurality of leads is plated with the metal; wherein a first respective window on a first side of each lead of the second plurality of leads is not plated with the metal; wherein a second respective window on a second side of each lead of the second plurality of leads is not plated with the metal;

wherein the lead frame further comprises
a third plurality of leads extending away from the one or more die paddles along a third direction perpendicular to the first direction; and
a fourth plurality of leads extending away from the one or more die paddles along a fourth direction opposite the third direction;

wherein a respective end surface of each lead of the third plurality of leads and the fourth plurality of leads is plated with the metal;

wherein a first respective window on a first side of each lead of the third plurality of leads and the fourth plurality of leads is not plated with the metal; and wherein a second respective window on a second side of each lead of the third plurality of leads and the fourth plurality of leads is not plated with the metal.

14. A semiconductor package comprising:
a lead frame comprising
one or more die paddles;
a first plurality of leads extending away from the one or more die paddles along a first direction; and
a second plurality of leads extending away from the one or more die paddles along a second direction opposite the first direction;
a chip attached to the one or more die paddles of the lead frame; and
a molding encapsulation enclosing the chip;
wherein a respective end surface of each lead of the first plurality of leads is plated with a metal;
wherein a first respective window on a first side of each lead of the first plurality of leads is not plated with the metal;
wherein a second respective window on a second side of each lead of the first plurality of leads is not plated with the metal;
wherein the first side of each lead is opposite the second side of each lead;
wherein the first respective window on the first side of each lead of the first plurality of leads and the second plurality of leads is of a rectangular shape;
wherein the second respective window on the second side of each lead of the first plurality of leads and the second plurality of leads is of the rectangular shape; and
wherein a height of the rectangular shape is in a range from seventy percent to ninety percent of a height of each lead of the first plurality of leads and the second plurality of leads.

15. The semiconductor package of claim 14, wherein a side of the rectangular shape is aligned with a side of each lead of the first plurality of leads and the second plurality of leads.

* * * * *